(12) United States Patent
Leray (10) Patent No.: US 9,190,247 B2
(45) Date of Patent: Nov. 17, 2015

(54) MEASUREMENT OF PLURAL RF SENSOR DEVICES IN A PULSED RF PLASMA REACTOR

(71) Applicant: APPLIED MATERIALS, INC., Santa Clara, CA (US)

(72) Inventor: Gary Leray, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 171 days.

(21) Appl. No.: 14/164,509

(22) Filed: Jan. 27, 2014

(65) Prior Publication Data
US 2014/0232374 A1 Aug. 21, 2014

Related U.S. Application Data

(60) Provisional application No. 61/767,534, filed on Feb. 21, 2013.

(51) Int. Cl.
*G01R 31/40* (2014.01)
*H01J 37/32* (2006.01)
*G01R 19/00* (2006.01)

(52) U.S. Cl.
CPC ....... *H01J 37/32082* (2013.01); *H01J 37/3299* (2013.01); *H01J 37/32146* (2013.01); *H01J 37/32174* (2013.01); *H01J 37/32935* (2013.01); *G01R 19/0061* (2013.01)

(58) Field of Classification Search
CPC .......... G01R 31/40; G01R 27/28; H03L 7/00; G01F 19/00
USPC ........................................................ 324/96
See application file for complete search history.

(56) References Cited

U.S. PATENT DOCUMENTS

| | | | |
|---|---|---|---|
| 6,716,477 B1 * | 4/2004 | Komiyama | ............ C23C 16/44 427/8 |
| 2012/0084037 A1 * | 4/2012 | Tanaka | ................... G01R 27/28 702/85 |

* cited by examiner

*Primary Examiner* — Tung X Nguyen
*Assistant Examiner* — Zannatul Ferdous
(74) *Attorney, Agent, or Firm* — Robert M. Wallace (57) ABSTRACT

In a plasma reactor having pulsed RF plasma power sources, measurements by RF sensors of nulls attributable to pulse duty cycles are replaced by non-zero measurements synthesized from prior non-zero measurements, to prevent feedback control system instabilities.

12 Claims, 7 Drawing Sheets

MEASUREMENT OF PLURAL RF SENSOR DEVICES IN A PULSED RF PLASMA REACTOR

CROSS-REFERENCE TO RELATED APPLICATIONS

This application claims the benefit of U.S. Provisional Application Ser. No. 61/767,534, filed Feb. 21, 2013 entitled MEASUREMENT OF PLURAL RF SENSOR DEVICES IN A PULSED RF PLASMA REACTOR, by Gary Leray.

BACKGROUND

Plasma process control in a plasma reactor typically relies upon a feedback control loop governing the RF power generators in response to plural RF sensors at different locations in the reactor. For example, RF power of different frequencies may be applied through one or more RF impedance matches to an electrode in the workpiece support. In such a case, one or more feedback control loops governing the RF generators or RF impedance matches may respond to RF sensor devices placed at the inputs and outputs of the RF impedance matches. Respective RF sensors may be provided for the respective RF power frequencies at the inputs and outputs of the impedance matches. In one example, two RF power frequencies are applied to the workpiece support electrode, so that four RF sensor devices are employed, one for each of the two frequencies at the impedance match inputs and outputs. Each RF sensor device may be capable of measuring RF parameters such voltage, current and/or phase.

A problem arises if the applied RF power is pulsed. During each pulse duty cycle off-time, the applicable RF sensor device reports a zero RF power level, which introduces an instability into the feedback control loop governing the respective RF power generator. The problem is complicated on a further level because the RF power of the different RF frequencies may be pulsed at different pulse frequencies (pulse repetition rates) and with different duty cycles. The non-zero measurement values obtained during the pulse duty cycle on-times are needed by the feedback control loops, but the zero measurement values obtained during the pulse duty cycle off-times are false and moreover introduce instabilities into the feedback control loops. A simplistic approach of merely suppressing all zero measurements would be unworkable because it would suppress those measurements that have a true zero value during a pulse duty cycle on-time, thereby introducing errors. One difficulty is how to distinguish between false zero measurements attributable to the pulse duty cycle off-times, and a true measurement of zero. There is an unfulfilled need to overcome the foregoing problems while allowing for the different pulse parameters at the different RF sensor devices and while concurrently capturing measurements from all the RF sensor devices at sufficiently high sampling rates required by the feedback control loops governing the RF power generators or RF impedance matches.

SUMMARY

In a plasma processing system employing pulsed RF power sources and respective RF sensor devices responsive to respective ones of said plural RF sources, reporting of measurement values from said respective RF sensors to controller components of the RF power sources is performed by repetitively obtaining individual measurement values from individual ones of said respective RF sensor devices in succession and reporting the measurement values of non-zero amplitudes. For each measurement value of zero amplitude obtained at a current time from a particular one of said RF sensor devices, a zero amplitude is reported only if the previous measurement values from the one RF sensor device have been zero for at least a predetermined wait time. Otherwise, what is reported is a non-zero amplitude derived from an applicable one of (a) the previous measurement value or (b) the most recent non-zero measurement value. In this manner, zero measurements attributable to the null period of the pulse duty cycle are filtered from the measurement signals used by the RF power source control system.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 4A, 4B and 4C are contemporaneous timing diagrams, of which FIG. 4A depicts the repetitive succession of measurements of the RF sensor devices, FIG. 4B depicts a first example of an applied pulsed RF power waveform sensed by one of the RF sensor devices, and FIG. 4C depicts the resulting output from the output processor of FIG. 1.

FIGS. 5A, 5B and 5C are contemporaneous timing diagrams, of which FIG. 5A depicts the repetitive succession of measurements of the RF sensor devices, FIG. 5B depicts a second example of an applied pulsed RF power waveform sensed by one of the RF sensor devices, and FIG. 5C depicts the resulting output from the output processor of FIG. 1.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
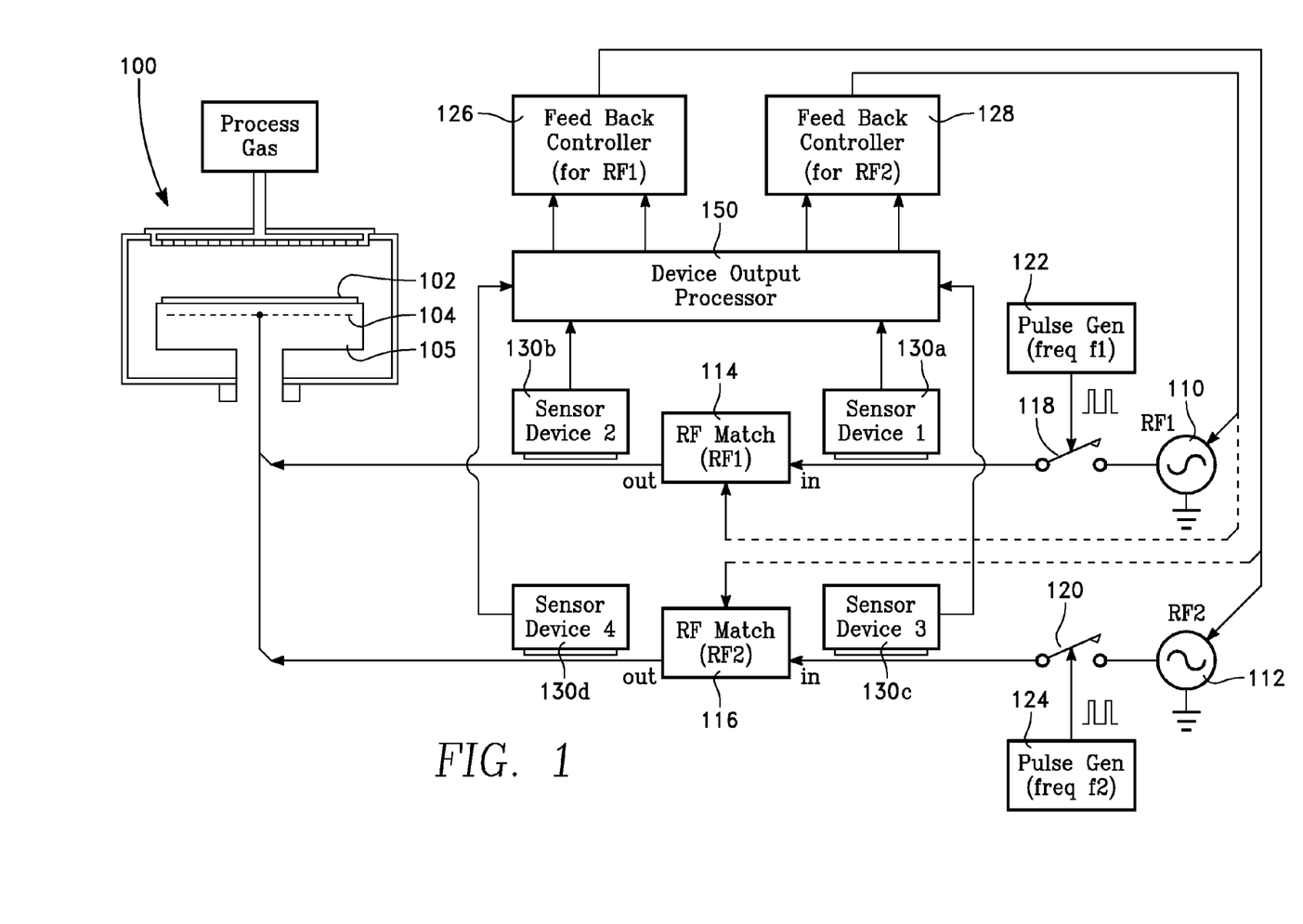
FIG. 1 is a block diagram depicting one example of a plasma reactor employing pulsed RF power sources, in which multiple RF sensor devices are coupled to respective feedback control loops through an output processor.

Referring to FIG. 1, a plasma processing system includes a processing chamber 100 for processing a workpiece 102 such as a semiconductive wafer, for example. RF power is applied to an RF power applicator, which in FIG. 1 is depicted as an electrode 104 in a workpiece support 105. However, the RF power applicator may be an electrode at the reactor chamber ceiling or may be inductive coil antennas (not illustrated) provided over the chamber ceiling. The RF power source delivers pulsed RF power of different RF frequencies coupled to the power applicator.

In the illustrated example, the RF power source consists of two RF power generators 110, 112 of different frequencies, RF1 and RF2, coupled to the RF power applicator through respective RF impedance matches 114, 116. The RF power generators 110, 112 are gated by respective switches 118, 120 controlled by respective pulse generators 122, 124 of respective pulse frequencies (pulse repetition rates) f1 and f2 and duty cycles. Respective feedback controllers 126, 128 govern the respective RF generators 110, 112 or govern the respective RF impedance matches 114, 116. The feedback controller 126 responds to RF sensor devices 130a, 130b at the input and output respectively of the RF impedance match 114. The feedback controller 128 responds to RF sensor devices 130c, 130d at the input and output respectively of the RF impedance match 116. The RF sensor devices 130a-130d may sense RF voltage, RF current and/or RF phase, for example. While FIG. 1 depicts an example employing two different RF frequencies and four RF sensing devices, the example may include more RF frequencies and more RF sensing devices.

The outputs from the RF sensor devices 130a-130d are processed by an output processor before being furnished to the feedback controllers 126, 128. As will be described below, the output processor 150 enables concurrent measurements of all the RF sensor devices 130a-130d while suppressing temporary zero measurements from the RF sensor devices 130a-130d attributable to the pulse duty cycles.

Figure 2:
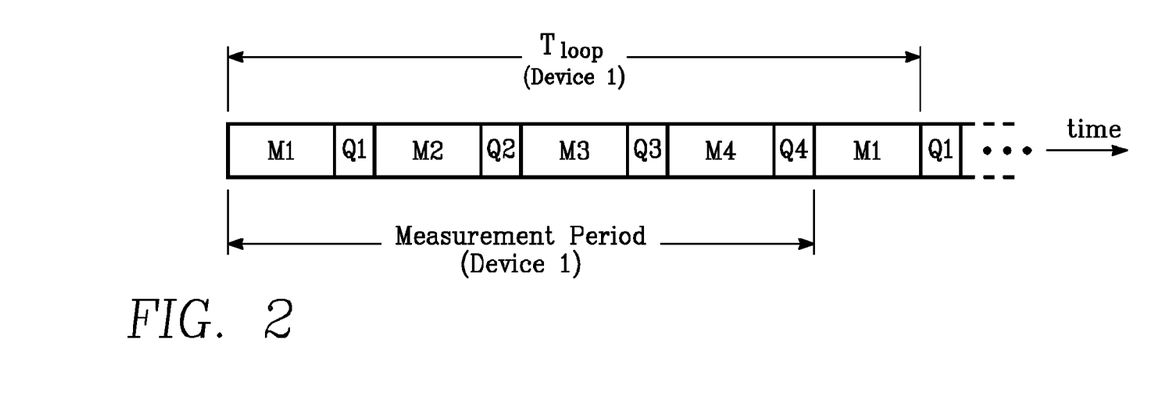
FIG. 2 is a timing diagram depicting one aspect of the operation of the output processor of FIG. 1 in which measurements from the RF sensor devices are obtained in repetitive serial succession.

Referring to FIG. 2, outputs of the RF sensor devices 130a-130d are repetitively measured in serial succession during separate time windows. In this specification, the RF sensor devices 130a through 130d may be referred to as RF sensor devices 1 through 4, and each may be specified by a device index i, as the $i^{th}$ sensor device. In FIG. 2, the time windows for measuring the respective outputs of the RF sensing devices 1 through 4 (the RF sensing devices 130a through 130d of FIG. 1) are denoted M1, M2, M3 and M4 respectively. The times required to switch from each RF sensor device to the next one are labeled Q1, Q2, Q3 and Q4, respectively. The period between successive measurements of an RF sensing device (e.g., the RF sensing device 1) is the measurement period and is denoted in FIG. 2 as P. The minimum time encompassing two successive measurements of the $i^{th}$ RF sensing device is labeled $Tloop_i$. For device 1, $Tloop_1$=P+M1. In general, $Tloop_i$=P+Mi.

Figure 3:
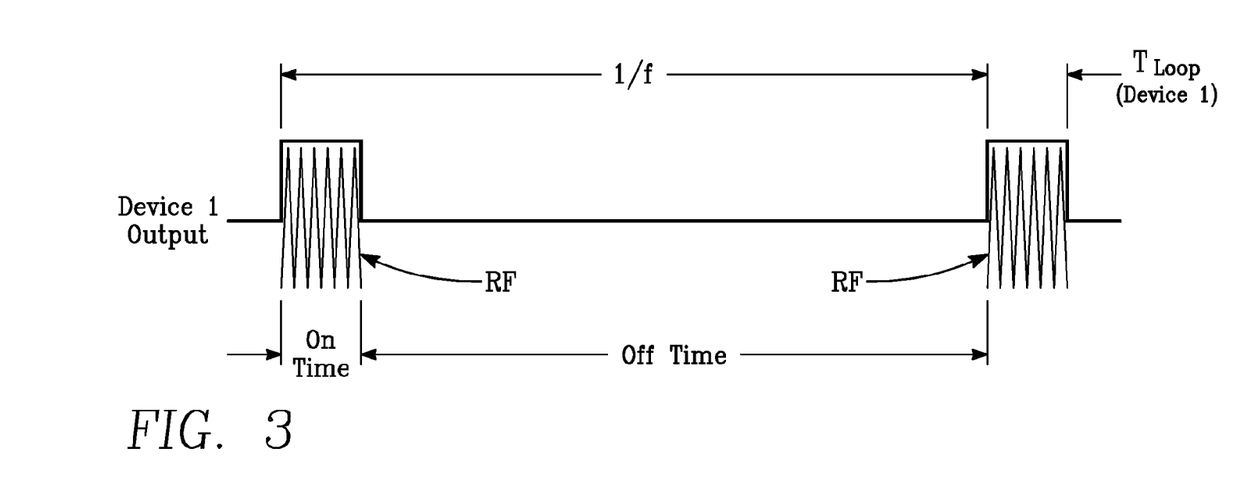
FIG. 3 depicts the relationship of the RF power time domain waveform measured by one RF sensor device and the loop time required to obtain two successive measurements from one RF sensor device.

FIG. 3 depicts one example of the time domain waveform of the pulsed RF output of the RF sensor device 1, and shows that the time value of $Tloop_1$ for device 1 is shorter than the pulse on-time.

Figure 4A:
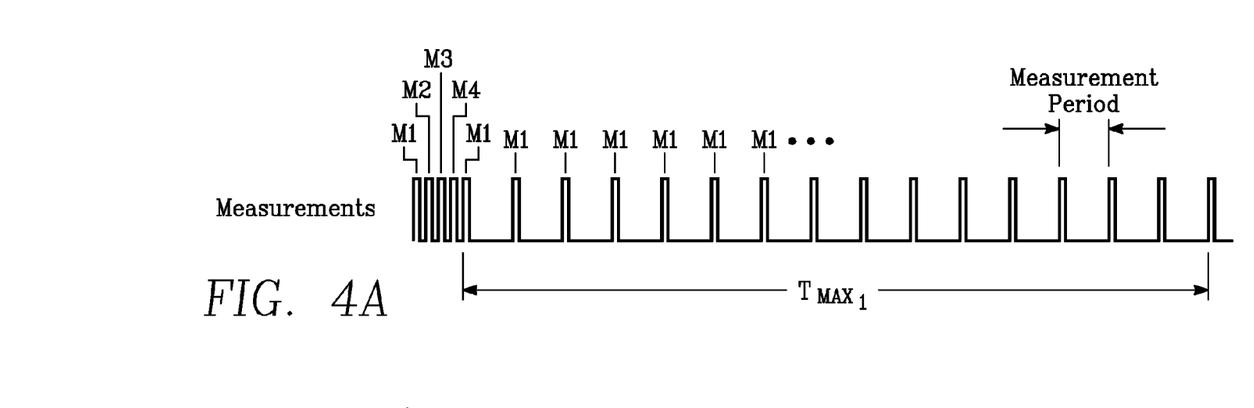

FIG. 4A corresponds to FIG. 2 with a compressed time scale. FIG. 4A depicts all measurement windows M1 through M4 for an initial complete measurement cycle, and thereafter shows only the successive occurrences of the measurement window M1, during which the output of RF sensor device 1 is measured.

Figure 4B:
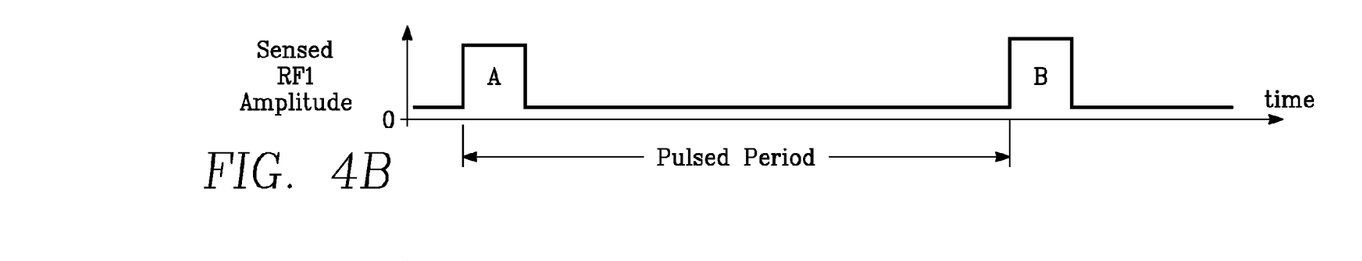

FIG. 4B is contemporaneous with FIG. 4A and depicts a first example of a pulsed RF waveform sensed by RF sensor device 1, in which the RF power (e.g., from the RF generator 110) is continuously "on", but is interrupted by the switch 118 in synchronism with the pulsed duty cycle. Specifically, FIG. 4B indicates that two non-zero pulses, labeled "A" and "B", occur in succession in accordance with a pulse duty cycle of the example. If the RF sensor device output of FIG. 4B were furnished to the feedback controller 126, a zero amplitude between successive pulse on-times would be reported to the feedback control system at the pulse repetition rate of FIG. 4B, which would be undesirable.

Figure 4C:
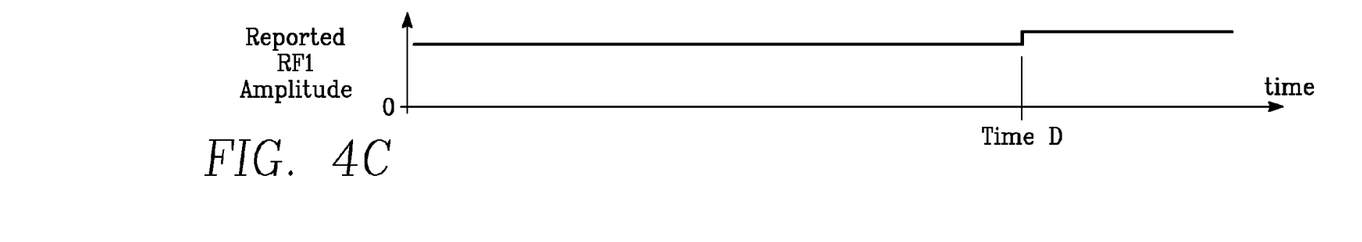

FIG. 4C depicts a result achieved in accordance with an embodiment, in which the output processor 150 of FIG. 1 prevents the reporting of the zero amplitude depicted in FIG. 4B. What is reported at each measurement window M1 during the null period of zero amplitude between the successive pulses A and B is the last reported non-zero amplitude. Thus, FIG. 4C shows that the reported amplitude does not change after the end of pulse A, but continues unchanged until the occurrence of the next measurement window M1 during the second pulse B (at time D of FIG. 4C). Such a response avoids a problem of feedback control instabilities attributable to the null period between successive pulses. At time D of FIG. 4C, the output processor 150 causes the latest measurement of RF sensor device 1 to be reported. FIG. 4C depicts a case in which the measurement at time D represents a slight increase in amplitude.

Figure 5A:
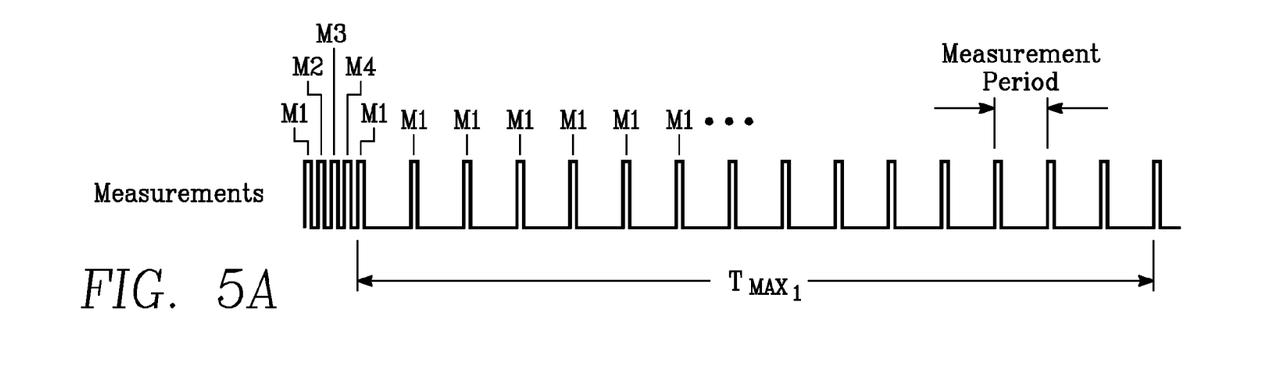
Figure 5B:
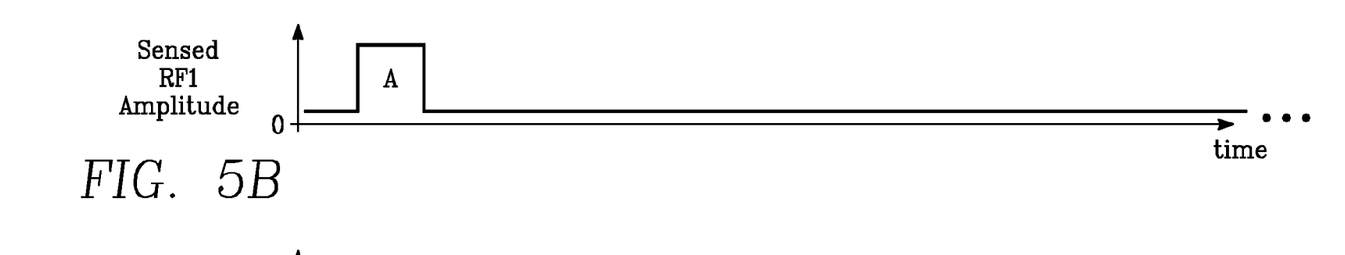
Figure 5C:
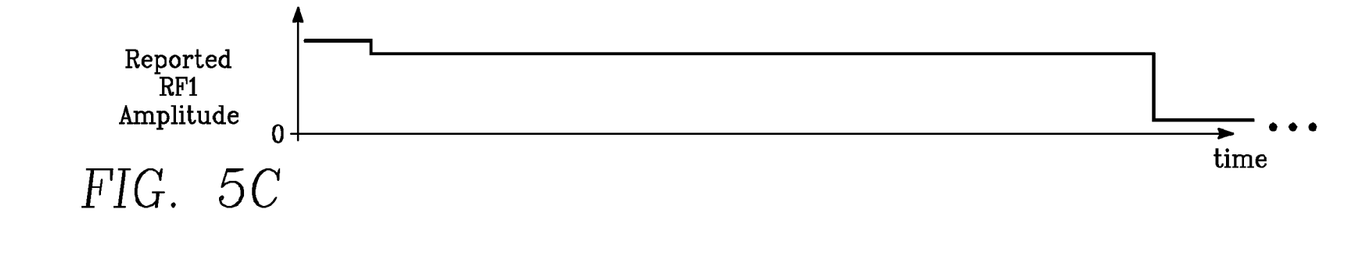

FIGS. 5A-5C depict a similar scenario, but one in which the RF signal actually goes to zero beyond the null period of the pulse duty cycle. In such a case, a zero value should be reported to the feedback control system. FIG. 5A corresponds to FIG. 4A and depicts a different (second) example of a pulsed RF waveform sensed by RF sensor device 1, in which the RF power (e.g., from the RF generator 110) is turned "off" sometime during the null period of the pulse duty cycle off-time. Specifically, FIG. 5B indicates that after the first non-zero pulse, labeled "A", and following the null period, there is no second pulse, and the measured amplitude remains at zero. As indicated in FIG. 5C, in this case the output processor 150 waits for a predetermined wait time, $Tmax_1$. Then, if the amplitude continues to remain at zero, the output processor 150 reports a zero amplitude to the feedback controller 126 at time E of FIG. 5C. The operation depicted in FIG. 5B is typical of the operations performed by the output processor 150, and a wait time $Tmax_i$ is predetermined for each one of the RF sensor devices. This determination will be described below.

Figure 6A:
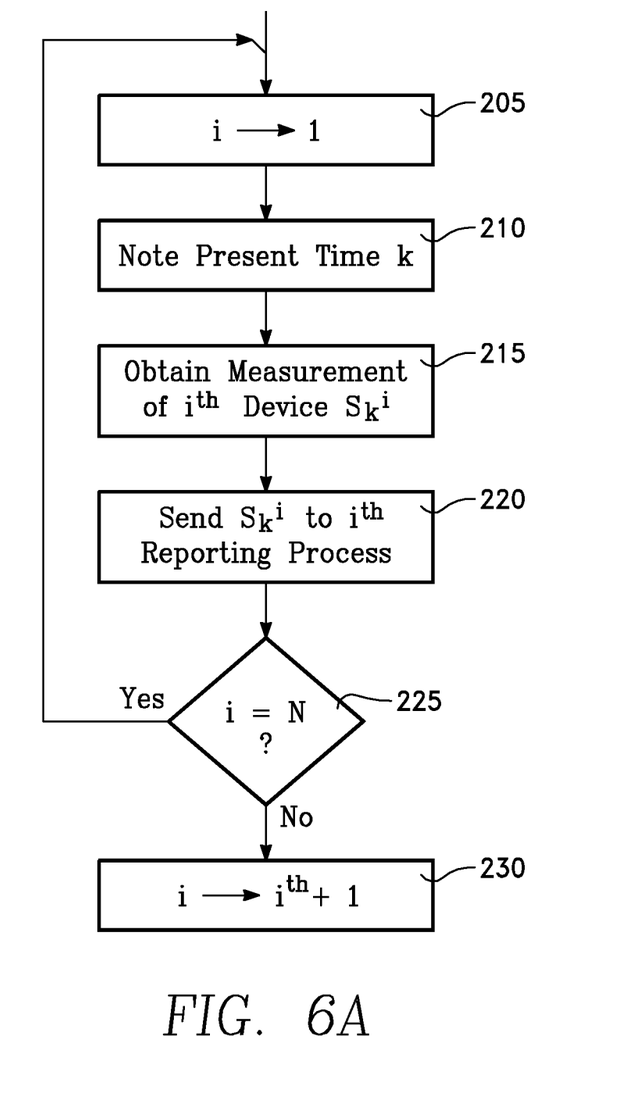
FIG. 6A is a block diagram depicting the operation of a loop process in the output processor of FIG. 1, in accordance with an embodiment.
Figure 6B:
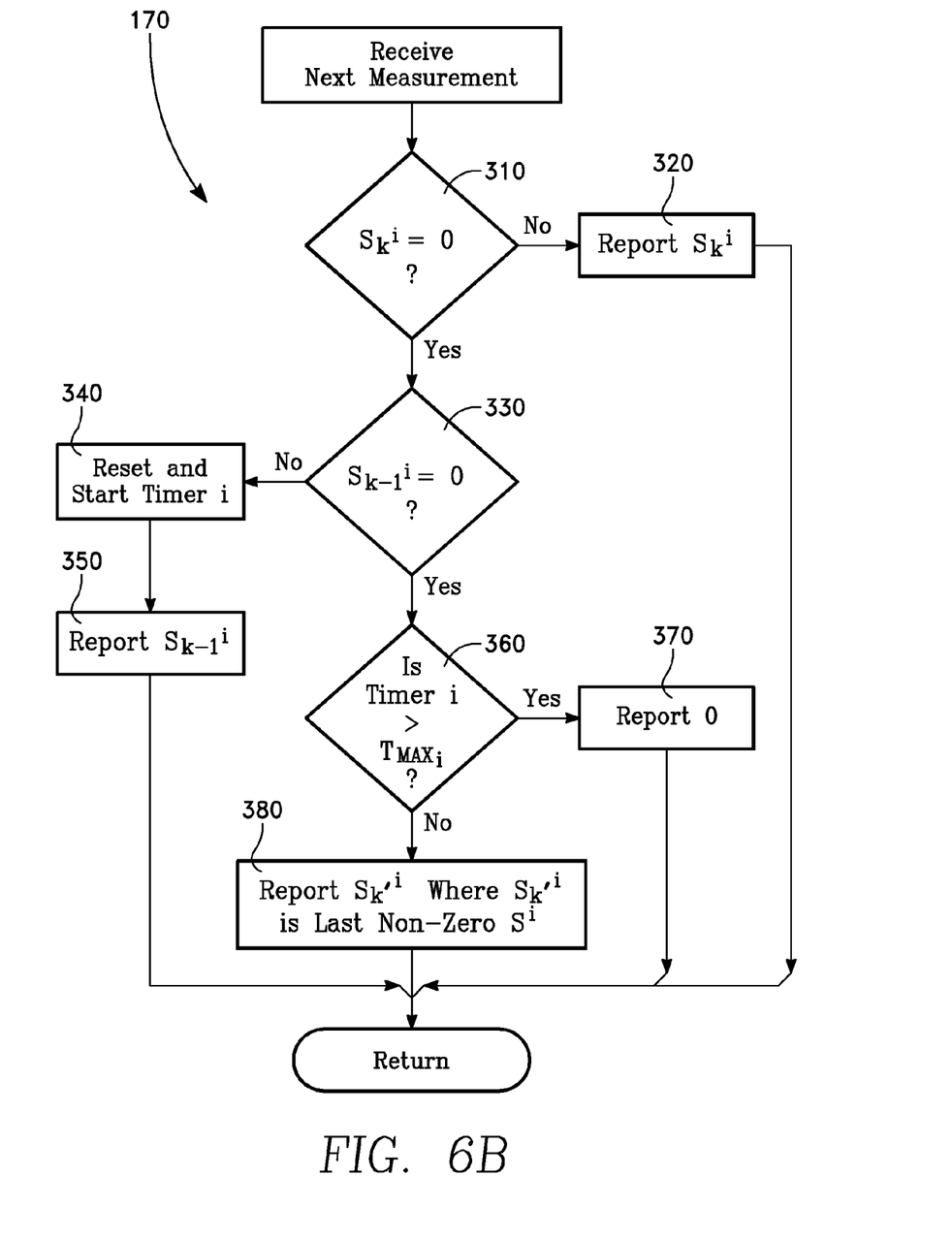
FIG. 6B is a block diagram depicting the operation of an individual reporting process in the output processor of FIG. 1, in accordance with an embodiment.
Figure 7:
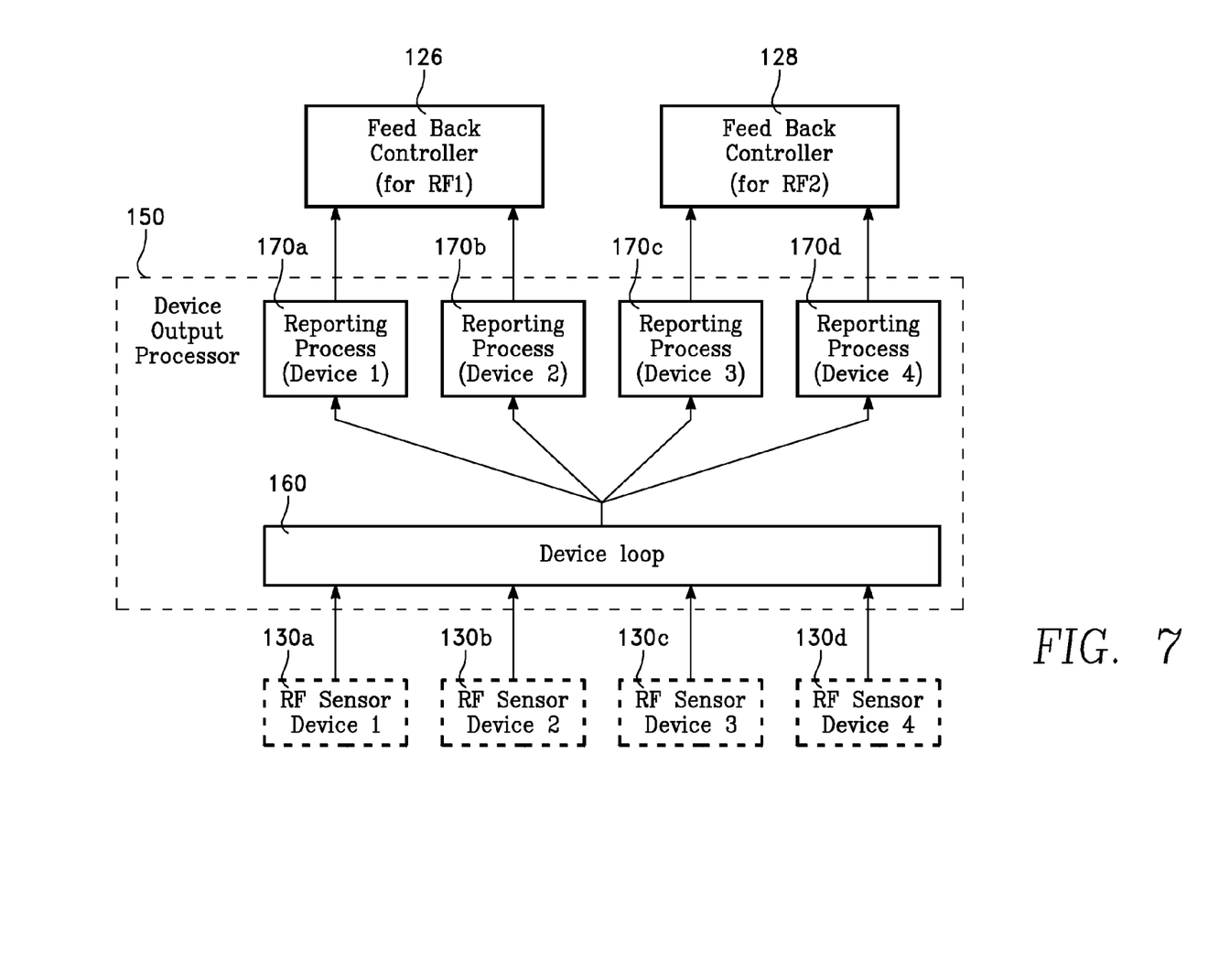
FIG. 7 is a block diagram depicting the internal architecture of the output processor of FIG. 1, in accordance with an embodiment.

The operation of the output processor 150 of FIG. 1 is depicted in FIGS. 6A and 6B in accordance with an embodiment. The architecture of the output processor 150 is depicted in FIG. 7 in accordance with one embodiment, and includes a device loop 160 and respective reporting processes 170-1, 170-2, 170-3, 170-4. It is understood that the device loop 160 of FIG. 7 and each of the reporting processes 170-1 through 170-4 may be implemented together in the output processor 150, which in one embodiment is a programmable device, such as a digital computer or microprocessor or field programmable gate array, for example. The output processor 150 may be programmed to perform the operations depicted in FIGS. 6A and 6B. For example, the operations depicted in FIGS. 6A and 6B may be represented in programming instructions stored on computer-readable media, such as the output processor 150, or an optical or magnetic disk, contained in the output processor 150 or accessed by the output processor 150, or in random access memory in the output processor 150.

FIG. 6A depicts the operation of the device loop 160 of FIG. 7, in which the RF sensor devices are repetitively polled (measured) in serial succession during the successive measurement times M1, M2, M3, M4, etc., to obtain successive measurement values.

FIG. 6B depicts the operation of a typical individual one of the reporting processes 170-1 through 170-4 (labeled as "170" in FIG. 6B). Each individual reporting process handles the output (a succession of measurements) from a corresponding one of the RF sensor devices 130a-130d.

The operation of the device loop 160 will now be described with reference to FIG. 6A. Each measurement value S is classified according to the corresponding RF sensor device and according to the time of the measurement. The number of each sensor device is denoted as the index i, while the current time is denoted by the index k. Thus, each measurement S is uniquely specified as $S_k^i$. Continuing to refer to FIG. 6A, the device loop 160 is initialized by setting the device index i to 1 (block 205 of FIG. 6A) and by noting the current time, i.e., the time index k (block 210). The $i^{th}$ sensor device output or measurement value is obtained and recorded as $S_k^i$ (block 215). The latest measurement value $S_k^i$ is sent to the $i^{th}$ reporting process (block 220 of FIG. 6A). For example, if i=1 then the measurement value is sent to the reporting process 170-1. If the current value of the device index i is N (YES branch of block 225), then operation returns to block 205. Otherwise (NO branch of block 225), the device index i is incremented by one (block 230) and the process resumes at block 210.

Operation of a typical one of the reporting processes 170-1 through 170-4 will now be described with reference to FIG. 6B. In this example, the reporting process depicted is the $i^{th}$ reporting process and processes the measurement values of the $i^{th}$ sensor device. The reporting process receives the latest measurement value of the $i^{th}$ sensor device from the device loop 160 and determines whether it is a zero value (block 310 of FIG. 6B). If not (NO branch of block 310), the value of $S_k^i$ is reported to the feedback control system (block 320). If the value of $S_k^i$ is zero (YES branch of block 310), then a determination is made of whether the preceding measurement value $S_{k-1}^i$ from the $i^{th}$ sensor device was zero (block 330). If not (NO branch of block 330), a timer (timer i) provided for the $i^{th}$ sensor is reset to zero and started (block 340). Also, the preceding measurement value $S_{k-1}^i$ is reported to the feedback control system (block 350). If the preceding measurement value $S_{k-1}^i$ from the $i^{th}$ sensor device was zero (YES branch of block 330), then a determination is made of whether timer i has exceeded a previously established wait time, $Tmax_i$ (block 360). If timer i has exceeded $Tmax_i$ (YES branch of block 360), then the zero amplitude of the current measurement value is presumed to be valid and a measurement value of zero is reported to the feedback control system (block 370). If timer has not exceeded $Tmax_i$ (NO branch of block 360), then the last non-zero measurement value of the $i^{th}$ sensor device, $S_{k'}^i$, is reported to the feedback control system (block 380). The time index k' in $S_{k'}^i$ refers to the last time the measurement value of the $i^{th}$ sensor device was non-zero.

After reporting a measurement value to the feedback control system in accordance with block 320, 350, 370 or 380, the $i^{th}$ reporting process is ready for receipt of the next measurement value of the $i^{th}$ sensor device.

There are certain constraints in the process of FIG. 6B. One constraint is that, for the $i^{th}$ sensor device, $Tloop_i$ is shorter than the shortest pulse duty cycle experienced by the $i^{th}$ sensor device. This ensures that there will be at least one measurement during each on-time of the pulse duty cycle. A further constraint is that the wait time $Tmax_i$ exceeds the longest pulse period experienced by the $i^{th}$ sensor device. This constraint may be stated in terms of the minimum pulse frequency, $fmin_i$, experienced by the $i^{th}$ sensor device as:

$$Tmax_i = 1/(fmin_i) + margin,$$

where the margin may be selected by the skilled worker to accommodate system variations. A further constraint is that the maximum pulse frequency experienced by the $i^{th}$ sensor device, $fmax_i$, is the ratio of $DC_i$, the pulse duty cycle at $fmax_i$, to $Tloop_i$. This may be expressed as:

$$fmax_i = DC_i/(Tloop_i).$$

As described above, the embodiment of FIGS. 6A, 6B and 7 suppresses or prevents the reporting of any zero measurement whose zero value is attributable to the occurrence of a pulse duty cycle off-time, and which therefore is not a true indication of the output of the corresponding sensor. By repeating the most recent non-zero measurement during such suppression, a truer indication of the sensor output is realized during the pulse duty cycle off-time. This maintains feedback control loop stability. Further, the embodiment of FIGS. 6A, 6B and 7 performs the difficult task of distinguishing between a false zero measurement and a true zero measurement. Specifically, it refrains from reporting a zero measurement until a succession of zero measurements have been received over the wait time $Tmax_i$ defined above. Suppression of true zero measurements is prevented. Also, the embodiment of FIGS. 6A, 6B and 7 controls the reporting of measurement values for each sensor individually, to accommodate different pulse frequencies, pulse duty cycles and RF frequencies among the different sensors. This latter result is realized by providing the separate individual reporting processes 170-1 through 170-4 of FIG. 7.

The illustrated embodiments may be modified. For example, FIG. 7 depicts a system having four sensors 130a-130d, requiring four reporting processes 170a-170d, but the number of sensors and reporting processes may exceed (or be less than) four.

While the foregoing is directed to embodiments of the present invention, other and further embodiments of the invention may be devised without departing from the basic scope thereof, and the scope thereof is determined by the claims that follow.

What is claimed is:

1. In a plasma processing system comprising plural RF power sources and respective RF sensor devices, each of said plural RF sources having an RF frequency, a pulse frequency and a pulse duty cycle, a method of reporting of measurement values, comprising:
   repetitively obtaining individual measurement values from individual ones of said respective RF sensor devices in succession and reporting the measurement values of non-zero amplitudes;
   for each measurement value of zero amplitude obtained at a current time from a particular one of said RF sensor devices, reporting a zero amplitude only if the previous measurement values from the one RF sensor device have been zero for at least a predetermined wait time, and otherwise reporting a non-zero amplitude corresponding to an applicable one of (a) the previous measurement value or (b) the most recent non-zero measurement value.

2. The method of claim 1 wherein said wait time exceeds the reciprocal of the minimum pulse frequency experienced by said one RF sensor device.

3. The method of claim 1 wherein said obtaining individual measurement values comprises polling all of said RF sensor devices in succession once within a measurement period including measurement time windows of all said RF sensor devices, and wherein the sum of said measurement period and a measurement time window of a particular RF sensor device constitutes a loop time of said particular RF sensor device, and wherein said loop time is less than a pulse on time experienced by said particular RF sensor device.

4. The method of claim 1 wherein said reporting comprises sending said measurement values to a feedback control loop of said system.

5. In a plasma processing system comprising plural RF power sources and respective RF sensor devices responsive to respective ones of said plural RF sources, each of said plural RF sources having an RF frequency, a pulse frequency and a pulse duty cycle, a method of controlling the reporting of measurement values from said respective RF sensors, said method comprising:
   repetitively obtaining individual measurement values from individual ones of said respective RF sensor devices in succession;
   for each measurement value obtained at a current time from a particular one of said RF sensor devices:
      (A) if the measurement value is not zero, reporting the measurement value;
      (B) if the measurement value is zero, then:
         (1) if the previous measurement value from the same RF sensor device is not zero, reporting the previous measurement value, and starting a timer;
         (2) if the previous measurement value is zero, comparing the timer to a wait time and:
            (a) if timer exceeds the wait time, reporting zero as the measurement amplitude,
            (b) if the timer does not exceed the wait time, reporting the last non-zero measurement from the one RF sensor device.

6. The method of claim 5 wherein said wait time exceeds the reciprocal of the minimum pulse frequency experienced by said one RF sensor device.

7. The method of claim 5 wherein said obtaining individual measurement values comprises polling all of said RF sensor devices in succession once within a measurement period including measurement time windows of all said RF sensor devices, and wherein the sum of said measurement period and a measurement time window of a particular RF sensor device constitutes a loop time of said particular RF sensor device, and wherein said loop time is less than a pulse on time experienced by said particular RF sensor device.

8. The method of claim 5 wherein said reporting comprises sending said measurement values to a feedback control loop of said system.

9. A non-transitory computer-readable medium having instructions for causing a computer to execute a method of reporting measurement values in a plasma processing system comprising plural RF power sources and respective RF sensor devices, each of said plural RF sources having an RF frequency, a pulse frequency and a pulse duty cycle, said method comprising:
   repetitively obtaining individual measurement values from individual ones of said respective RF sensor devices in succession and reporting the measurement values of non-zero amplitudes;
   for each measurement value of zero amplitude obtained at a current time from a particular one of said RF sensor devices, reporting a zero amplitude only if the previous measurement values from the one RF sensor device have been zero for at least a predetermined wait time, and otherwise reporting a non-zero amplitude corresponding to an applicable one of (a) the previous measurement value or (b) the most recent non-zero measurement value.

10. The computer-readable medium of claim 9 wherein said wait time exceeds the reciprocal of the minimum pulse frequency experienced by said one RF sensor device.

11. The computer-readable medium of claim 9 wherein said obtaining individual measurement values comprises polling all of said RF sensor devices in succession once within a measurement period including measurement time windows of all said RF sensor devices, and wherein the sum of said measurement period and a measurement time window of a particular RF sensor device constitutes a loop time of said particular RF sensor device, and wherein said loop time is less than a pulse on time experienced by said particular RF sensor device.

12. The computer-readable medium of claim 9 wherein said reporting comprises sending said measurement values to a feedback control loop of said system.

* * * * *